(12) United States Patent
Zhu

(10) Patent No.: US 9,887,159 B1
(45) Date of Patent: Feb. 6, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventor: Mengkai Zhu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/402,249

(22) Filed: Jan. 10, 2017

(30) Foreign Application Priority Data

Dec. 15, 2016 (CN) .......................... 2016 1 1159736

(51) Int. Cl.

| | |
|---|---|
| *H01L 21/768* | (2006.01) |
| *H01L 23/528* | (2006.01) |
| *H01L 29/41* | (2006.01) |
| *H01L 29/78* | (2006.01) |
| *H01L 29/66* | (2006.01) |
| *H01L 21/762* | (2006.01) |
| *H01L 21/033* | (2006.01) |
| *H01L 29/06* | (2006.01) |
| *H01L 21/74* | (2006.01) |

(52) U.S. Cl.
CPC ...... *H01L 23/5283* (2013.01); *H01L 21/0332* (2013.01); *H01L 21/743* (2013.01); *H01L 21/76224* (2013.01); *H01L 21/76816* (2013.01); *H01L 21/76877* (2013.01); *H01L 29/0653* (2013.01); *H01L 29/66492* (2013.01); *H01L 29/7833* (2013.01)

(58) Field of Classification Search
CPC ......... H01L 21/76877; H01L 21/76816; H01L 21/76895
See application file for complete search history.

(56) References Cited

U.S. PATENT DOCUMENTS

| | | | |
|---|---|---|---|
| 6,720,242 B2 | 4/2004 | Burbach et al. | |
| 7,064,078 B2 | 6/2006 | Liu et al. | |
| 2002/0055244 A1* | 5/2002 | Burbach | H01L 21/743 438/586 |
| 2004/0121599 A1* | 6/2004 | Aminpur | H01L 21/743 438/689 |
| 2011/0260248 A1* | 10/2011 | Smeys | H01L 21/76898 257/347 |
| 2014/0273386 A1* | 9/2014 | Tsao | H01L 29/665 438/301 |

\* cited by examiner

*Primary Examiner* — Zandra Smith
*Assistant Examiner* — Molly Reida
(74) *Attorney, Agent, or Firm* — Winston Hsu

(57) ABSTRACT

A method for fabricating semiconductor device includes the steps of: providing a substrate having a first semiconductor layer, an insulating layer, and a second semiconductor layer; forming an active device on the substrate; forming an interlayer dielectric (ILD) layer on the substrate and the active device; forming a mask layer on the ILD layer; removing part of the mask layer, part of the ILD layer, and part of the insulating layer to form a first contact hole; forming a patterned mask on the mask layer and into the first contact hole; and removing part of the mask layer and part of the ILD layer to form a second contact hole exposing part of the active device.

10 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming contact plug penetrating through a silicon-on-insulator (SOI) substrate and contact plug penetrating interlayer dielectric (ILD) layer to connect to an active device.

2. Description of the Prior Art

In the manufacturing of semiconductors devices, SOI wafers or substrates are used to provide superior isolation between adjacent devices in an integrated circuit as compared to devices built into bulk wafers. SOI substrates are silicon wafers with a thin layer of oxide or other insulators buried in it. Devices are built into a thin layer of silicon on top of the buried oxide. The superior isolation thus achieved may eliminate the "latch-up" in CMOS devices and further reduces parasitic capacitances.

Current fabrication process for fabricating active device such as metal-oxide semiconductor (MOS) transistors on a SOI substrate typically involves the formation of at least two different sizes of contact plugs, including a contact plug connected to the active device and a backside contact plug penetrating the SOI substrate and connecting to another silicon wafer. However, current fabrication for these two types of contact plugs still poses numerous drawbacks. Hence, how to provide a simple as well as cost effective way for fabricating a device containing these elements has become an important task in this field.

SUMMARY OF THE INVENTION

According to an embodiment of the present invention, a method for fabricating semiconductor device includes the steps of: providing a substrate having a first semiconductor layer, an insulating layer, and a second semiconductor layer; forming an active device on the substrate; forming an interlayer dielectric (ILD) layer on the substrate and the active device; forming a mask layer on the ILD layer; removing part of the mask layer, part of the ILD layer, and part of the insulating layer to forma first contact hole; forming a patterned mask on the mask layer and into the first contact hole; and removing part of the mask layer and part of the ILD layer to form a second contact hole exposing part of the active device.

According to another aspect of the present invention, a semiconductor device includes: a substrate having a first semiconductor layer, an insulating layer, and a second semiconductor layer; an active device on the substrate; an interlayer dielectric (ILD) layer on the active device; a first contact plug adjacent to the active device; and a second contact plug in the ILD layer and electrically connected to the active device. Preferably, the first contact plug includes: a first portion in the insulating layer and the second semiconductor layer and a second portion in the ILD layer, in which a width of the second portion is greater than a width of the first portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
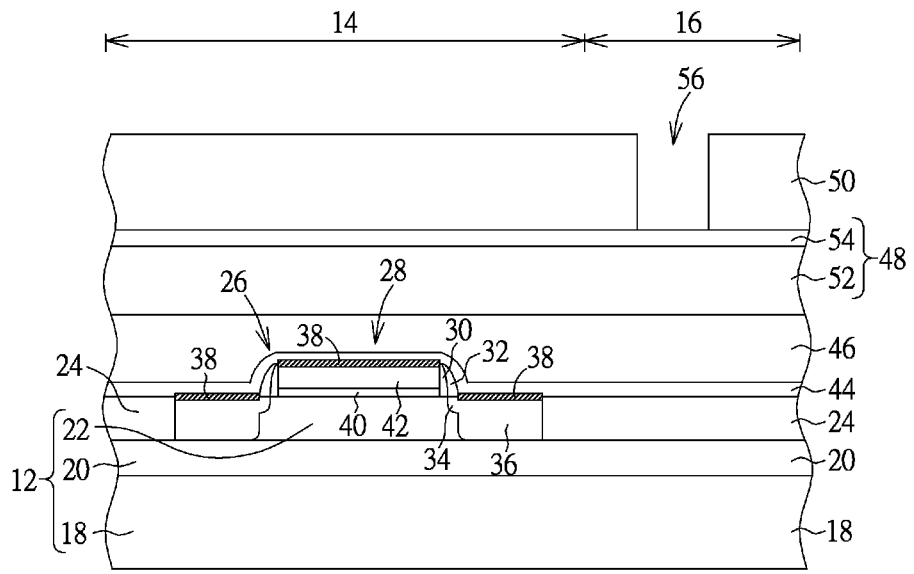
FIG. 1 illustrates a method for fabricating a semiconductor device according to a preferred embodiment of the present invention.

Referring to FIGS. 1-5, FIGS. 1-5 illustrate a method for fabricating a semiconductor device according to a preferred embodiment of the present invention. As shown in FIG. 1, a substrate 12 is provided and a first region 14 and a second region 16 are defined on the substrate 12, in which the first region 14 is preferably used for fabricating active device such as metal-oxide semiconductor (MOS) transistors and the second region 16 is used for fabricating backside contact plug penetrating the entire substrate 12 and connecting to another substrate or semiconductor wafer.

In this embodiment, the substrate 12 is preferably a silicon-on-insulator (SOI) substrate, which preferably includes a first semiconductor layer 18, an insulating layer 20 on the first semiconductor layer 18, and a second semiconductor layer 22 on the insulating layer 20. Preferably, the first semiconductor layer 18 and the second semiconductor layer 22 could be made of same material or different material and could both be made of material including but not limited to for example silicon, germanium, or silicon germanium (SiGe). The insulating layer 20 disposed between the first semiconductor layer 18 and second semiconductor layer 22 preferably includes $SiO_2$, but not limited thereto. It should be noted that even though a SOI substrate is chosen as the substrate for the semiconductor device of this embodiment, the substrate 12 could also be made of semiconductor substrate material including but not limited to for example silicon substrate, epitaxial silicon substrate, or silicon carbide substrate, which are all within the scope of the present invention.

Next, as part of the second semiconductor layer 22 could be removed to form a shallow trench isolation (STI) 24 around the second semiconductor layer 22, which an active device is preferably formed on the second semiconductor layer 22 surrounded by the STI 24.

Next, an active device 26 is formed on the substrate 12. In this embodiment, the active device 26 is preferably a MOS transistor, which preferably includes a gate structure 28, a spacer 30 and spacer 32 on the sidewalls of the gate structure 28, a lightly doped drain 34 in the second semiconductor layer 22 adjacent to two sides of the spacer 30, a source/drain region 36 in the second semiconductor layer 22 adjacent to two sides of the spacer 32, a selective epitaxial layer (not shown) in the second semiconductor layer 22 adjacent to two sides of the spacer 32, and a selective silicide 38 on the surface of the source/drain region 36 and the top of the gate structure 28.

In this embodiment, the gate structure 28 further includes a gate dielectric layer 40 and a gate material layer 42 or gate electrode on the gate dielectric layer 40, in which the gate dielectric layer 40 could include $SiO_2$, silicon nitride, or high-k dielectric layer and the gate material layer 24 could include metal, polysilicon, or silicides.

Each of the spacer 30 and spacer 32 could be a single spacer made of material including but not limited to for example $SiO_2$, SiN, SiON, SiCN, or combination thereof. Nevertheless, according to an embodiment of the present invention, each of the spacers 30 and 32 could also be a composite spacer including a first sub-spacer (not shown) and a second sub-spacer (not shown), in which one of the first sub-spacer and the second sub-spacer could be L-shaped or I-shaped, the first sub-spacer and the second sub-spacer could be made of same material or different material, and both the first sub-spacer and the second sub-spacer could be made of material including but not limited to for example $SiO_2$, SiN, SiON, SiCN, or combination thereof, which are all within the scope of the present invention.

Next, a contact etch stop layer (CESL) 44 preferably made of silicon nitride is formed on the substrate 12 to cover the gate structure 28 and an ILD layer 46 is formed on the CESL 44. Next, a mask layer 48 and a patterned resist 50 are formed in the ILD layer 46, in which the mask layer 48 preferably includes am amorphous carbon film (APF) 52 and a dielectric antireflective coating (DARC) 54 on the APF 52 and the patterned resist 50 includes an opening 56 exposing the surface of part of the DARC 54 on the second region 16.

Figure 2:
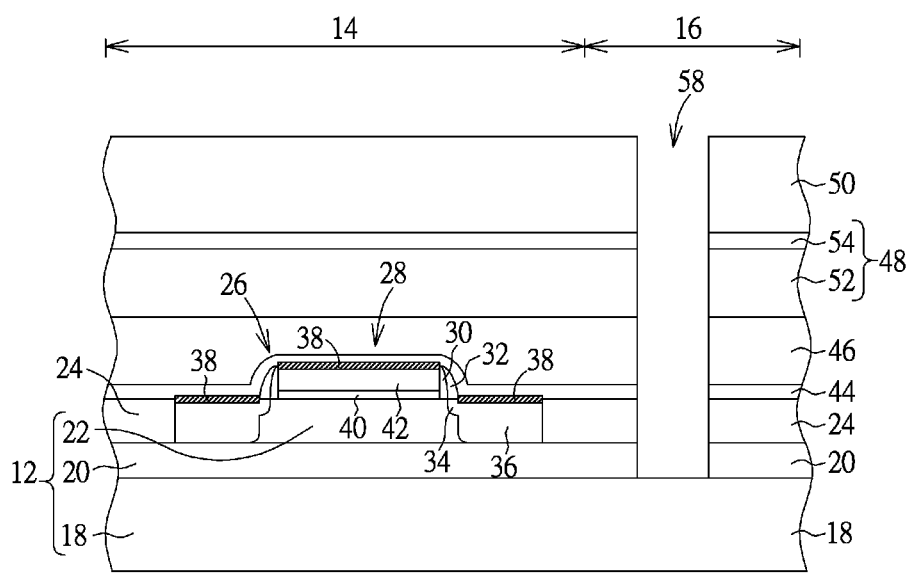
FIG. 2 illustrates a method for fabricating a semiconductor device according to a preferred embodiment of the present invention following FIG. 1.

Next, as shown in FIG. 2, an etching process is conducted by using the patterned resist 50 as mask to remove part of the DARC 54, part of the APF 52, part of the ILD layer 46, part of the CESL 44, part of the STI 24, and part of the insulating layer 20 on the second region 16 to form a first contact hole 58, in which the first contact hole 58 preferably exposes the surface of the first semiconductor layer 18. In this embodiment, an etching gas used to form the first contact hole 58 could be selected from the group consisting of octafluorocyclobutane ($C_4F_8$), argon, and oxygen gas, but not limited thereto.

Figure 3:
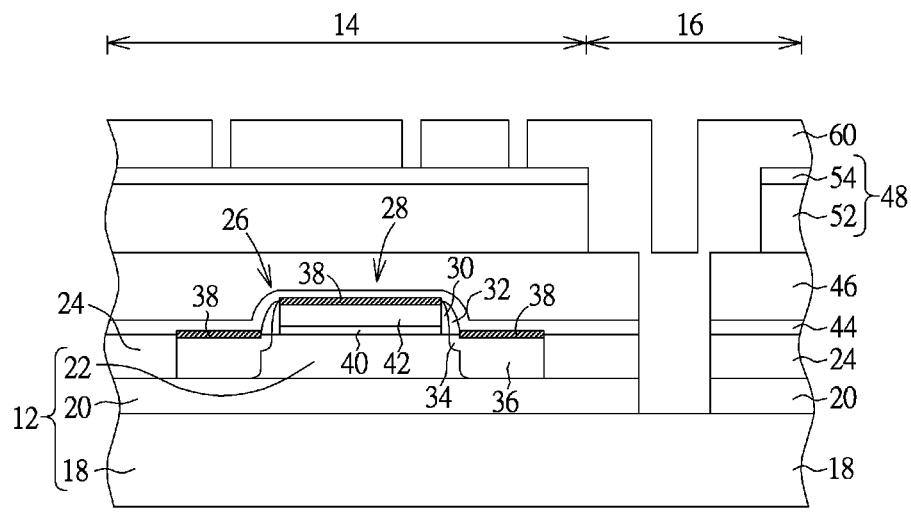
FIG. 3 illustrates a method for fabricating a semiconductor device according to a preferred embodiment of the present invention following FIG. 2.

Next, as shown in FIG. 3, an oxygen gas could be used to strip the patterned resist 50 and at the same time remove part of the sidewall of the mask layer 48, in which this removal step particularly removes part of the DARC 54 and part of the APF 52 immediately adjacent to the first contact hole 58 on the second region 16 thereby expanding the size of the first contact hole 58 within the DARC 54 and APF 52. In other words, the first contact hole 58 on the second region 16 at this stage includes two different widths, in which the width of the first contact hole 58 within the DARC 54 and APF 52 is greater than the width of the first contact hole 58 within the ILD layer 46, CESL 44, STI 24, and insulating layer 20.

Next, a patterned mask 60 is formed on the mask layer 48 and filled into the first contact hole 58, in which the patterned mask 60 preferably fills the first contact hole 58 having smaller width within the ILD layer 46, CESL 44, STI 24, and insulating layer 20 completely but does not fill the first contact hole 58 having greater width within the DARC 54 and APF 52 completely. In this embodiment, the patterned mask 60 is preferably a patterned resist, but not limited thereto.

Figure 4:
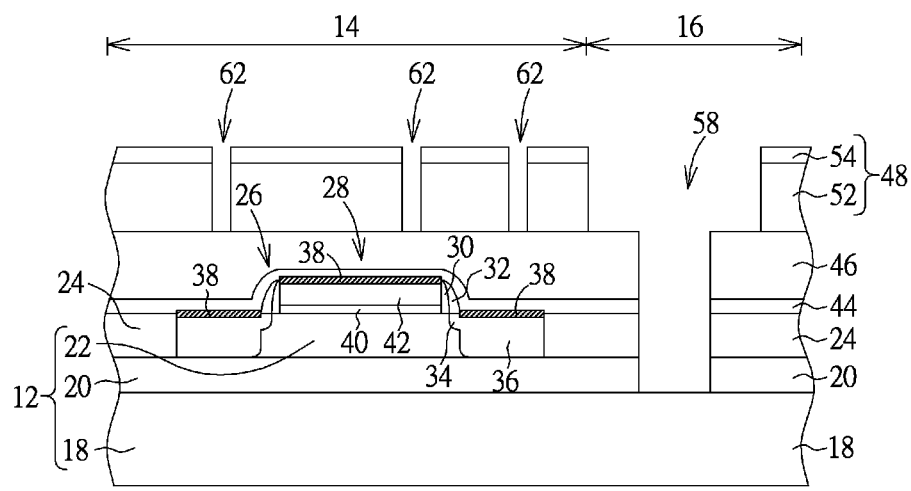
FIG. 4 illustrates a method for fabricating a semiconductor device according to a preferred embodiment of the present invention following FIG. 3.

Next, as shown in FIG. 4, a first etching process is conducted by using the patterned mask 60 as mask to remove part of the mask layer 48, in particularly part of the DARC 54 and part of the APF 52 on the first region 14 for exposing the surface of part of the ILD layer 46 underneath. In other words, the first etching process preferably transfers the pattern of the patterned mask 60 to the mask layer 48 for forming a plurality of second contact plugs 62. It should be noted that most or even all of the patterned mask 60 would be removed or consumed by the etching gas while part of the DARC 54 and part of the APF 52 are etched to expose the DARC 54 on the first region 14 and the ILD layer 46 on the second region 16 underneath. Hence after the second contact holes 62 are formed in the DARC 54 and APF 52, most of the patterned mask 60 are likely be removed to expose the top surface and sidewalls of the mask layer 48 on first region 14 as well as the first contact hole 58 on the second region 16.

Figure 5:
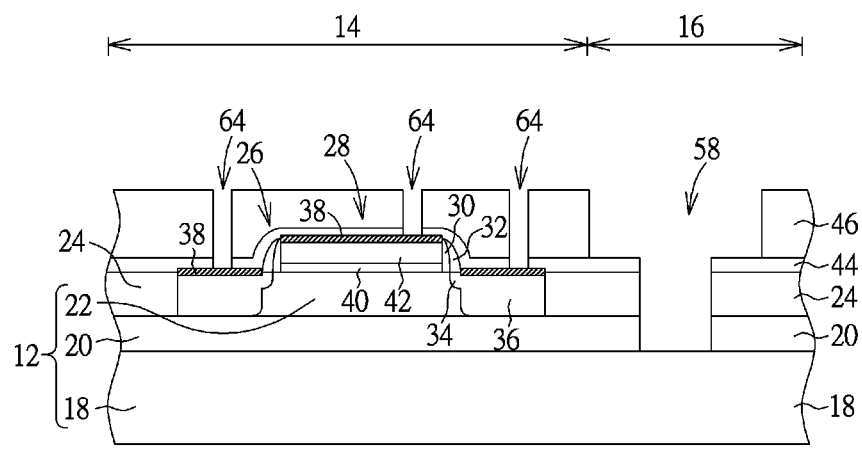
FIG. 5 illustrates a method for fabricating a semiconductor device according to a preferred embodiment of the present invention following FIG. 4.

Next, as shown in FIG. 5, a second etching process is conducted by using the DARC 54 as mask to transfer the pattern of the second contact holes 62 within the DARC 54 and APF 52 to the ILD layer 46 and CESL 44. This forms second contact holes 64 within the ILD layer 46 and CESL 44 on the first region 14, in which the second contact holes 64 expose the gate structure 28 and the source/drain region 36 of the active device 26. It should be noted that since no hard mask is disposed or shielded on top of the ILD layer 46 on the second region 16 during the second etching process, part of the ILD layer 46 on the second region 16 would then be removed to expand the first contact hole 58 in the ILD layer 46 and expose the top surface of CESL 44 underneath during the formation of the second contact holes 64 on the first region 14. Next, an oxygen plasma treatment could be employed to strip the remaining patterned mask 60, DARC 54, and APF 52 and expose the top surface of ILD layer 46.

Figure 6:
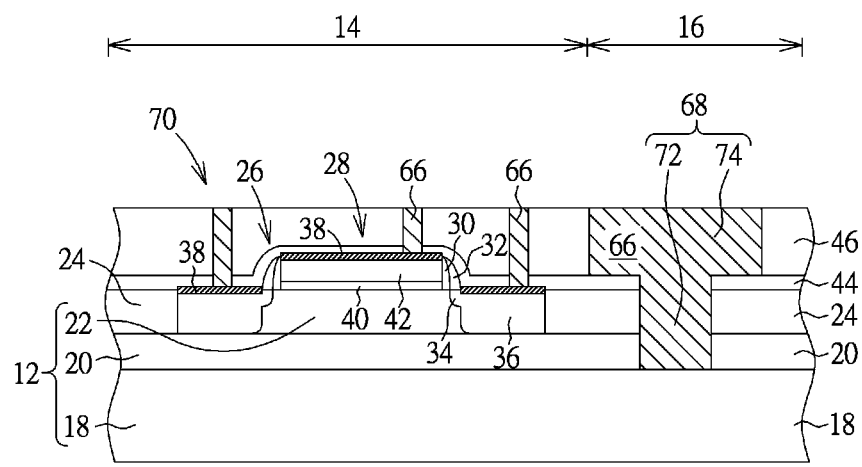
FIG. 6 illustrates a method for fabricating a semiconductor device according to a preferred embodiment of the present invention following FIG. 5.

Next, as shown in FIG. 6, a contact plug formation is conducted by forming a conductive layer 66 in the first contact hole 58 and second contact holes 64, in which the conductive layer 66 further includes a barrier layer (not shown) and a metal layer (not shown). Next, a planarizing process such as chemical mechanical polishing (CMP) process is conducted to remove part of the metal layer, part of the barrier layer, and even part of the ILD layer 46 to form a first contact plug 68 within the ILD layer 46 and substrate 12 on second region 16 and second contact plugs 70 within the ILD layer 46 on the first region 14 to electrically connect the gate structure 28 and source/drain region 36. Preferably, the first contact plug 68 on the second region 16 includes a first portion 72 embedded in the insulating layer 20 and STI 24 and a second portion 74 in the ILD layer 46. In this embodiment, the barrier layer could be selected from the group consisting of Ti, Ta, TiN, TaN, and WN and the metal layer could be selected from the group consisting of Al, Ti, Ta, W, Nb, Mo, and Cu.

Next, follow-up process could be carried out depending on the demand of the product by performing a metal-interconnect process to form multiple inter-metal dielectric (IMD) layers and metal interconnections on the ILD layer, removing the first semiconductor layer 18 completely to expose the bottom surface of the insulating layer 20 and the bottom of the first contact plug 68, and then adhering another fabricated substrate or semiconductor wafer onto the bottom of the insulating layer 20, in which the two substrates could be connected electrically through the first contact plug 68. This completes the fabrication of a semiconductor device according to a preferred embodiment of the present invention.

According to an embodiment of the present invention, it would also be desirable to apply the aforementioned fabrication of backside contact plug penetrating the entire substrate 12 on second region 16 to the fabrication of a through-silicon via (TSV). For instance, it would be desirable to extend the depth of the first contact hole 58 downward during the formation of first contact hole 58 in FIG. 2 so that the first contact hole 58 would be formed into part of the first semiconductor layer 18 but without penetrating through the first semiconductor layer 18. Next, processes shown in FIGS. 3-6 are conducted to fill the first contact hole 58 with conductive layer and then planarizing part of the first semiconductor layer 18 until exposing the bottom of the first contact plug 68. In contrast to the structure shown in FIG. 6, the bottom of the first portion 72 of first contact plug 68 in this embodiment would be embedded within the first semiconductor layer 18 instead of even with the bottom of the insulating layer 20.

Referring again to FIG. 6, FIG. 6 illustrates a structural view of a semiconductor device according to a preferred embodiment of the present invention. As shown in FIG. 6, the semiconductor device includes a substrate 12, a first region 14 and second region 16 defined on the substrate 12, an active device 26 disposed on the substrate 12, a ILD layer 46 disposed on the active device 26, a first contact plug 68 disposed in the ILD layer 46 and substrate 12 on second region 16 and second contact plugs 70 disposed in the ILD layer 46 on first region 14 to electrically connect to the active device 26.

The substrate 12 is preferably a SOI substrate including a first semiconductor layer 18, an insulating layer 20, and a second semiconductor layer 22, and the active device 26 preferably includes a gate structure 28 disposed on the second semiconductor layer 22 and a source/drain region 36 in the second semiconductor layer 22 adjacent to two sides of the gate structure 28.

Viewing from a more detailed perspective, the first contact plug 68 includes a first portion 72 embedded in the insulating layer 20, second semiconductor layer 22, and STI 24 and a second portion 74 in the ILD layer 46, in which the width of the second portion 74 is preferably greater than the width of the first portion 72, the width of the first portion 72 is greater than the width of each of the second contact plugs 70, the width of the second portion 74 is greater than the width of each of the second contact plugs 70, and the top surfaces of the second portion 74, second contact plugs 70, and ILD layer 46 are coplanar.

Next, a CESL 44 is disposed on the gate structure 28 and the substrate 12, in which the sidewalls of the CESL 44 are aligned with sidewalls of the STI 24, insulating layer 20, and the first semiconductor layer 18. Preferably, a distance measured from a top surface of the STI 24 or second semiconductor layer 22 to a top surface of the ILD layer 46 is between 2000 Angstroms to 3000 Angstroms, and a distance measured from a bottom surface of the insulating layer 20 to the top surface of the ILD layer 46 is approximately 5000 Angstroms.

Figure 7:
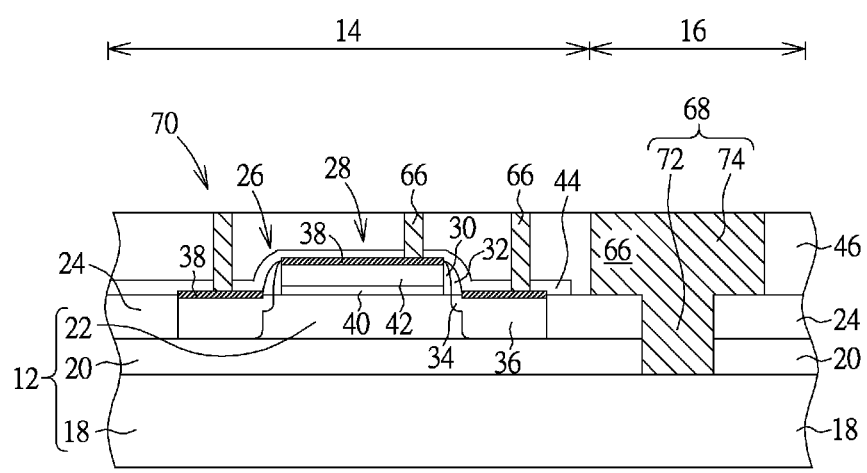
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to the aforementioned embodiment of disposing the ILD layer 46 on an un-cut CESL 44, it would be desirable to first remove part of the CESL 44 on second region 16 during a silicide process after FIG. 1 so that when part of the mask layer 48, part of the ILD layer 46, part of the STI 24, and part of the insulating layer 20 are removed to form the first contact hole 58 in FIG. 2, none of the CESL 44 would be removed during the etching process or the sidewall of the CESL 44 would be completely covered under the ILD layer 46 instead of being exposed in the first contact hole 58 as shown in FIG. 2. Next, processes from FIGS. 3-6 could be carried out to complete the fabrication of a first contact plug 68 and second contact plugs 70. Since part of the CESL 44 has been removed so that none of the CESL 44 is formed on the second region 16 prior to the formation of ILD layer 46, the first portion 72 and second portion 74 of the first contact plug 68 would not be contacting the CESL 44 directly afterwards, which are also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate, wherein the substrate comprises a first semiconductor layer, an insulating layer, and a second semiconductor layer;
   forming an active device on the substrate;
   forming an interlayer dielectric (ILD) layer on the substrate and the active device;
   forming a mask layer on the ILD layer;
   removing a sidewall portion of the mask layer after removing part of the mask layer, part of the ILD layer, and part of the insulating layer to form a first contact hole;
   forming a patterned mask on the mask layer and into the first contact hole; and
   removing part of the mask layer and part of the ILD layer to form a second contact hole exposing part of the active device.

2. The method of claim 1, wherein the active device comprises:
   a gate structure on the second semiconductor layer; and
   a source/drain region adjacent to two sides of the gate structure and in the second semiconductor layer.

3. The method of claim 2, further comprising forming a shallow trench isolation (STI) around the source/drain region.

4. The method of claim 3, further comprising:
   forming a contact etch stop layer (CESL) on the second semiconductor layer and the gate structure; and
   forming the ILD layer on the CESL.

5. The method of claim 3, further comprising:
   forming a contact etch stop layer (CESL) on the second semiconductor layer and the gate structure;
   removing part of the CESL; and
   forming the ILD layer on and contact the CESL and the STI.

6. The method of claim 1, further comprising:
   performing a first etching process by using the patterned mask as mask to remove part of the mask layer and remove the patterned mask at the same time; and
   performing a second etching process to remove part of the ILD layer for forming the second contact hole and expanding the first contact hole within the ILD layer.

7. The method of claim 1, further comprising:
forming a conductive layer in the first contact hole and the second contact hole; and
removing part of the conductive layer to form a first contact plug in the ILD layer and the substrate and a second contact plug in the ILD layer, wherein the first contact plug comprises a first portion in the insulating layer and the second semiconductor layer and a second portion in the ILD layer.

8. The method of claim 7, wherein a width of the second portion is greater than a width of the first portion.

9. The method of claim 7, wherein a width of the first portion is greater than a width of the second contact plug.

10. The method of claim 1, wherein the mask layer comprises:
an amorphous carbon film (APF); and
a dielectric antireflective coating (DARC) on the APF.

* * * * *